United States Patent
Yamasaki et al.

(10) Patent No.: US 6,674,017 B1
(45) Date of Patent: Jan. 6, 2004

(54) MULTILAYER-WIRING SUBSTRATE AND METHOD FOR FABRICATING SAME

(75) Inventors: Kozo Yamasaki, Gifu (JP); Osamu Hisada, Aichi (JP); Katsuhiko Hasegawa, Aichi (JP); Naoki Kito, Aichi (JP); Satoshi Hirano, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/471,332

(22) Filed: Dec. 23, 1999

(30) Foreign Application Priority Data

Dec. 24, 1999 (JP) ............................................ 10-365957

(51) Int. Cl.⁷ ............................ H01R 12/04; H05K 1/00
(52) U.S. Cl. ............................ 174/262; 29/847; 29/853
(58) Field of Search ............................ 174/262–265; 361/792–795; 24/847, 852, 853

(56) References Cited

U.S. PATENT DOCUMENTS

| | | | |
|---|---|---|---|
| 5,321,211 A | * 6/1994 | Haslem et al. | 174/262 |
| 5,541,367 A | * 7/1996 | Swamy | 174/260 |
| 5,597,983 A | * 1/1997 | Nguyen et al. | 174/264 |
| 5,638,598 A | * 6/1997 | Nakaso et al. | 29/852 |
| 6,002,172 A | * 12/1999 | Desai et al. | 257/737 |
| 6,222,136 B1 | * 4/2001 | Appelt et al. | 174/254 |
| 6,373,717 B1 | * 4/2002 | Downes, Jr. et al. | 361/795 |

FOREIGN PATENT DOCUMENTS

| | | | |
|---|---|---|---|
| JP | 9-205268 | 8/1997 | H05K/3/18 |
| JP | 2760952 | 3/1998 | H05K/3/06 |
| JP | 10-207081 | 8/1998 | G03F/7/30 |

* cited by examiner

Primary Examiner—David L. Talbott
Assistant Examiner—Jeremy Norris
(74) Attorney, Agent, or Firm—Sughrue Mion, PLLC

(57) ABSTRACT

A multilayer-wiring substrate having a via hole structure and method for fabricating the same. Referring to FIGS. 1(a) and 1(b), after a via-hole 5 is formed by exposure and development in lithography or by laser-drilling, a bottom portion of the via-hole 5 is subjected to resin-etching so as to expose a surface 4A of a lower conductor 4 as shown in FIG. 3(b). The exposed surface 4A of the lower conductor 4 is chemically etched so that the conductor 4 is undercut. As a result, undesired material 5B such as adhered residual resin shown in FIG. 3(b) is completely removed. In etching the conductor 4 at the bottom of the via hole 5, the lower conductor 4 is preferably etched in an amount of 5–30% of the thickness of the lower conductor 4 to form a depression or recess 6A at a via hole bottom 5C as shown in FIG. 3(b), thereby reliably establishing electrical continuity between the lower conductor 4 and the upper conductor 8 by means of a via-hole conductor 7 as shown in FIG. 3(c).

14 Claims, 13 Drawing Sheets

MULTILAYER-WIRING SUBSTRATE AND METHOD FOR FABRICATING SAME

BACKGROUND OF THE INVENTION

1. Field of the Invention

This invention relates to a multilayer-wiring substrate for surface-mounting electronic and/or mechanical components, and particularly to such a substrate and method for making the same wherein at least two wiring conductors that sandwich an insulating layer are electrically connected by a via-hole conductor penetrating the insulating layer. More specifically, the present invention relates to a method for fabricating a multilayer-wiring substrate having wiring conductors formed alternatingly with insulating resin layers and having a via-conductor penetrating through the insulating resin layer(s) for establishing electrical continuity between the wiring conductors separated by the insulating layer(s).

2. Description of the Related Art

Some conventional steps for fabricating a multilayer-wiring substrate are described hereinafter referring to FIGS. 5(a)–5(b). A wiring conductor 14 is formed on a surface of an insulating resin layer 12 and then a photosensitive-resin layer 13 is coated on the insulating resin layer 12 and the wiring conductor 14. Next, the photosensitive-resin insulator layer 13 is exposed to light through a photomask and is then developed to thereby form a via-hole 15 so as to expose a surface of the wiring conductor, based on a photolithography method. Subsequently, another wiring conductor 18 is formed on a surface of the insulating resin layer 13 by, e.g., electroless copper plating or copper electroplating. At the same time, a via-conductor 17 is formed along an inner wall of the via-hole 15 to establish electrical connection between these wiring conductors 14,18, as seen in FIG. 5(b).

SUMMARY OF THE INVENTION

However, uniform development of a number of via-holes to be formed over an entire surface of a multilayer-wiring substrate by the photolithography method is difficult. In a certain portion of the multilayer-wiring substrate the via-holes may be accurately formed in the substrate, whereas, in another portion of the multilayer-wiring substrate, resin to be removed may remain on the bottoms of the via-holes due to inconsistent development speed of the photolithography. During the development of the via-hole, the resin which has once been dissolved in developer may accumulate on the bottom of the via-hole to prevent smooth feeding of new developer to the bottom of the via-hole. As a result, inward progress of development is hindered in a depth direction, resulting in insufficient development. As a result of such insufficient lithography, as shown in FIG. 5(c), the lower conductor 14 is not exposed through a bottom resin 15A of the via-hole 15. As a result, the lower wiring conductor 14 and the upper conductor wiring layer 18 are not connected by the via-conductor 17.

The bottom resin 15A has to be removed before forming the via-conductor, for example, by etching using a resin etchant such as a potassium permanganate solution. Even so, the bottom resin 15A is not removed completely and remains in a fragmental form in the via-hole 15, causing poor electrical continuity by way of the via-conductor between the lower conductor 14 and the upper conductor 18.

The present invention has been accomplished in view of the foregoing.

An object of the present invention is to provide a multilayer-wiring substrate with a via-conductor having a complete electrical connection and/or a lowest electrical impedance across lower and upper conductors separated by an insulating layer.

Another object of the invention is to provide a method for fabricating a multilayer-wiring substrate with a via-conductor having a uniform electrical continuity from a upper wiring conductor formed on a surface of an insulating layer to a lower wiring conductor formed on another surface of the insulating layer.

Still another object of the invention is to provide a method for completely removing undesired material adhered onto a wiring conductor that forms a bottom of a via-hole penetrating through an insulating resin layer so as to sufficiently expose the wiring conductor on which a solder bump or other via-conductor may be assuredly formed.

A further object of the invention is to provide a via-conductor structure penetrating straightly through at least two insulating layers of a multilayer wiring substrate.

According to a first aspect of the invention, a multilayer-wiring substrate is provided comprising:
- a wiring conductor with a recess formed by etching a surface of the wiring conductor,
- an insulating layer formed on a surface of the wiring conductor except over the recess;
- another insulating layer formed on the other surface of the wiring conductor;
- a via-hole penetrating through the insulating layer to the recess; and
- a via-conductor or a solder bump formed inside the via-hole and adhered to a recessed surface of the wiring conductor.

An advantage of this multilayer wiring substrate is that an area of the wiring conductor to which a via-conductor or a solder bump adheres is increased by the recess. In other words, since a recessed surface is formed at the wiring conductor, a strong mechanical and electrical connection is attained between the wiring conductor and the via-conductor or the solder bump. The via-conductor or the solder bump is formed in the via-hole of the insulating layer and partly in the recess of the wiring conductor.

When a depth of the recess is 5–30% of a thickness of the wiring conductor, a good result is attained in such a connection. Further, when the recess is made by chemically etching the wiring conductor, a better connection strength of the via-conductor or solder bump to the wiring conductor is attained.

When the via-conductor is made by plating copper onto an inner peripheral wall of the via-hole that penetrates the insulating layer and by extendingly plating copper on an etched and recessed portion of the wiring conductor at the via-hole bottom, the best electrical connection is attained between the electrical conductors sandwiching the insulating layer. A via-conductor is formed by plating metal such as copper onto the recessed wiring conductor whereat the via-hole forms a bottom, and the via-conductor may be formed by further plating metal extendingly on an inner peripheral wall of the via-hole. The via-hole connects the wiring conductor with other electrical conductors formed on the other surface of the insulating layer.

The above mentioned multilayer-structure may be supported on an insulating core plate having a thickness of 0.5–1 mm, since the conductor, e.g., a copper layer, is about 10–25 μm in thickness and the insulating layer coated on the copper is about 30–60 μm in thickness. A plurality of the structures may be formed on the core plate, with alternatingly forming the wiring conductor and the insulating layer.

Similar structure(s) may also be advantageously formed on the other side of the core plate in order to prevent warpage of the multilayer wiring substrate.

According to a second aspect of the invention, a method is provided for fabricating a multilayer-wiring substrate having a via-conductor in a via-hole, comprising:

forming an insulating layer on a wiring conductor; forming a via-hole in the insulating layer by removing the insulating layer to an extent that the insulating layer in the via-hole becomes fragmented and adheres to the wiring-conductor located at the bottom of the via-hole; then etching the wiring conductor located at the bottom of the via-hole so that the fragments are removed and a recess is formed in the conductor; and then forming a via-conductor in the via-hole by plating metal on an inner peripheral wall of the via-hole and extendingly plating the metal on a surface of the recessed portion of the wiring conductor.

Forming the via-hole in the insulator may be done by developing a photosensitive resin layer using a lithography technique or by laser-drilling the insulating layer.

An important step in the above described method according to the invention is etching the wiring conductor located at the bottom of the via hole after the via hole is made by photolithography development or by laser-drilling, so as to form the recess in the insulating layer. The photolithography can not completely remove the photosensitive resin layer stuck to the conductor layer by adhesion that will remain as undesired material at the via-hole bottom. Although the laser can drill the insulating layer easily, it leaves the undesired material carbonized or melted from the insulating layer on the bottom surface and the inner via-hole wall. Therefore, forming a recessed surface at the conductor layer surface after via-hole formation means perfect elimination of the undesired material from the surface of the via-conductor whereat the via-conductor is next to be formed.

When a plurality of the substrate structures are multilayered, a via-hole formed in the upper insulating layer is connected preferably in a concentric or coaxial position with the via-hole formed in the neighboring lower insulating layer. This enables one to electrically connect a via-conductor formed in a upper insulating layer with a via-conductor formed in a lower insulating layer in a shortest length with a smallest electrical impedance. The via-conductors can be aligned straightly through these via-holes in a thickness direction of the substrate, namely, in a perpendicular direction to the plane of the substrates, rendering the lowest electrical impedance across the insulating layers. When the via-conductor in the lower insulating layer is made by plating copper on the inner peripheral wall of the via-holes and on the recessed portion of the lower conductor, it is advantageous to fill the via-hole with the copper plating because a next insulating layer may be coated on the via-conductor which becomes a via hole bottom of the next via-hole that will be made through the next insulating layer. The via-hole bottom should be etched so as to form a recessed end surface of the via-conductor, to which recessed end surface a next via hole or a solder bump is connected.

A via-hole for forming a solder bump therein may be made in an outermost insulating layer of the multilayer-wiring substrate, in a manner penetrating through the outermost resin layer to an inner wiring copper layer formed at the inner side of the outermost resin layer. The surface of the inner wiring copper layer that forms a bottom of the via-hole may be plated with another metal such as gold and/or nickel so as to facilitate formation of the solder bump and to fix the solder bump firmly in the via-hole. An electrical continuity between the bottom metal of the via-hole and a terminal of a different electronic or other mechanical component is therefore accomplished by the solder ball formed inside the via-hole, regardless of whether the inner peripheral wall of the via-hole is plated or not.

An important feature of the above method of the present invention is that the fragments adhering to the conductor that forms a bottom of the via-hole is removed together with a portion of the conductor, by chemically etching the conductor on which the fragments are carried on. In other words, when the bottom conductor is chemically etched using an etchant, the etchant etches not only in the thickness direction but also in a planar direction of the bottom conductor and undercuts the conductor underneath the remainder, resulting in forming a recess in the bottom conductor as well as eliminating the fragments. Accordingly, the surface of the recessed area of the bottom conductor is cleaned up and the surface of the recessed conductor can be plated with a metal conductor such as copper, assuring that reliable electrical continuity and mechanical adhesion strength are established between upper and lower wiring conductors sandwiching the insulating layer.

According to a third aspect of the invention, a method is provided for fabricating a multilayer-wiring substrate, comprising:

forming a photosensitive resin layer on a wiring conductor; exposing the photosensitive resin layer to light through a photomask; making a via-hole in the photosensitive resin layer by developing the portions of the photosensitive resin exposed to light; chemically etching the photosensitive resin layer to an extent that the photosensitive resin layer becomes fragmented in the via-hole; undercutting the fragmentally remaining photosensitive resin at the bottom of the via-hole by chemically etching the wiring conductor that is exposed through the fragmentally remaining resin; forming a recess in the conductor by further chemically etching the wiring conductor, and forming a via-conductor in the via-hole by plating metal on an inner peripheral wall of the via-hole and on a surface of the wiring conductor that is chemically etched and recessed.

A feature of the above method according to the third aspect of the present invention is as follows. By chemically etching the surface of the conductor exposing through the fragmental remainder such as resin carried on the bottom of the via-hole, such remainder remaining partly or rather fragmentarily at the bottom of the via-hole can be undercut and removed together with a portion of the conductor. In other words, when the bottom conductor is chemically etched using an etchant, the etchant etches not only in the thickness direction but in a planar direction of the bottom conductor underneath the remainder, resulting in forming a recess at the bottom conductor. Accordingly, the surface of the recessed area of the bottom conductor is cleaned up and the surface of the recessed conductor can be plated with a metal conductor such as copper. This assures that reliable electrical continuity and mechanical adhesion strength are established by the via-hole penetrating the insulating layer. An upper conductor may be formed on the outermost insulating layer, which conductor may serve as a bonding pad for electrical connection from the inner wiring conductor to, e.g., a signal transmission terminal of a semiconductor chip.

The above method according to the third aspect may further comprise:

forming a second photosensitive resin layer on a second wiring conductor; exposing the second photosensitive resin layer to light through another photomask; making a second via-hole in the second photosensitive resin layer by developing the portions of the second photosensitive resin exposed to light; chemically etching the second photosensitive resin layer to an extent that the second photosensitive resin layer becomes fragmented in the second via-hole; undercutting the fragmentally remaining second photosensitive resin at the bottom of the second via-hole by chemically etching the second wiring conductor that is exposed through the fragmentally remaining resin; forming a recess in the second conductor by further chemically etching the second wiring conductor; and plating a metal on a surface of the second wiring conductor that is chemically etched and recessed.

A solder bump may be formed by soldering to a recessed area of the second wiring conductor and held in the second via-hole, for electrically connecting the second wiring conductor with an electronic component terminal outside.

An alternative way of making a via-hole in an insulating layer is to use a laser.

When the laser is used for making a via-hole in the insulating layer, the laser melts or burns some of the insulating layer material to be carbonized. In the case that a resin is used for the insulating layer, the carbonized material formed from the resin due to a burning action of the laser adheres to a surface of the conductor at the via-hole bottom. In the case that an inorganic insulating material such as glass, ceramic and a mixture thereof is used for the insulating layer, the laser melts the inorganic insulating material which is splashed during formation of the via-hole onto a surface of the conductor. The present invention teaches that removal of any undesired material adhered on the surface of the conductor at the via hole bottom is necessary before forming a via-conductor in the via-hole for electrical connecting the upper and lower conductors sandwiching the insulating layer(s), and provides a method for removing such undesired material by chemically etching the conductor existing underneath the lower conductor. A recess should be formed in the wiring conductor formed on the insulating layer and extendingly formed on the end of the via-conductor so as to assure such electrical connection by the via-conductor between upper and lower wiring conductors. When a depth of the recess becomes 5–30% of the thickness of the wiring conductor that is normally in the range of 10–25 $\mu$m in thickness, the best electrical connection is attained, according to the invention.

In a case of making a multilayer-wiring substrate having inorganic insulating layers made of ceramic, glass-ceramic or glass alternated with metal-wiring layers made of at least one of copper, nickel, gold, silver, palladium, tungsten and molybdenum, a method of making such an inorganic multilayer-substrate may include a step of co-firing green (unfired) insulating layers and metal-wiring layers to form a fired multilayer-wiring substrate, before forming a solder bump on a multilayer-wiring substrate.

DETAILED DESCRIPTION OF THE INVENTION

Herein, no particular limitations are imposed on the multilayer-wiring substrate, so long as dielectric or rather insulating layers and wiring conductors are alternatingly formed and a via-hole formed in the insulating layer electrically connects the wiring conductors. Examples of such a substrate include a multiyear-wiring substrate that has a core plate of a metal, glass, ceramic, resin layer and/or a plurality thereof. The dielectric resin layers and the wiring conductors may be arranged in alternating layers and formed on one side or both sides of the core substrate.

As indicated in the SUMMARY OF THE INVENTION, the wiring conductor at the bottom of the via-hole is etched in an amount of 5–30% of the thickness of the conductor, forming a recess in the conductor. If the conductor is etched in an amount of less than 5% of the thickness thereof, the residual resin on the bottom is insufficiently removed and specifically, as shown in FIG. 4(b), a surface 4A exposed through the residual resin 5B is eluted by etching, whereas a portion of the conductor 4 underlying the resin 5B is not sufficiently eluted.

Figure 4:
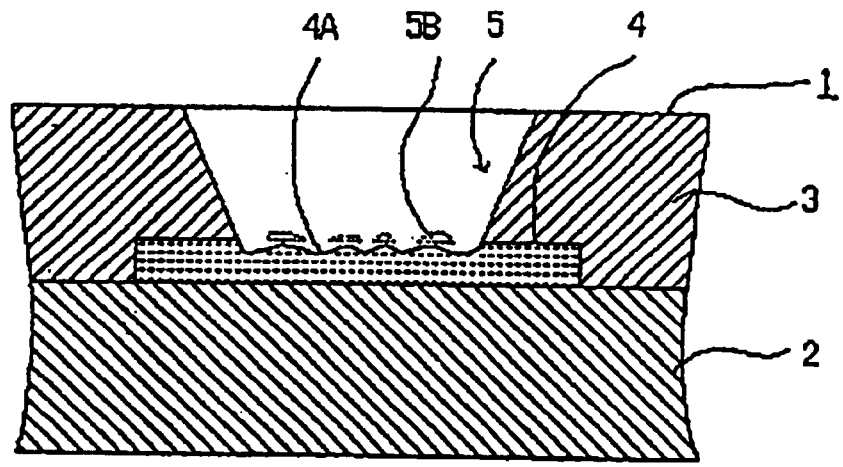
FIG. 4(a) is an explanatory view with a schematic cross section illustrating how the wiring conductor 4 is etched by etchant undercutting the bottom conductor (4A) beneath the undesired fragmental remainders (5B) to remove the same.
FIG. 4(b) is an explanatory view with a schematic cross section illustrating that the wiring conductor is insufficiently etched by resin-etchant leaving the fragmental remainders (5B) on the bottom conductor (4A).
FIG. 4(c) is an explanatory view with a schematic cross section illustrating the formation of an overhang portion (5C) when etching reaches a portion of the lower conductor (4).
Figure 4:
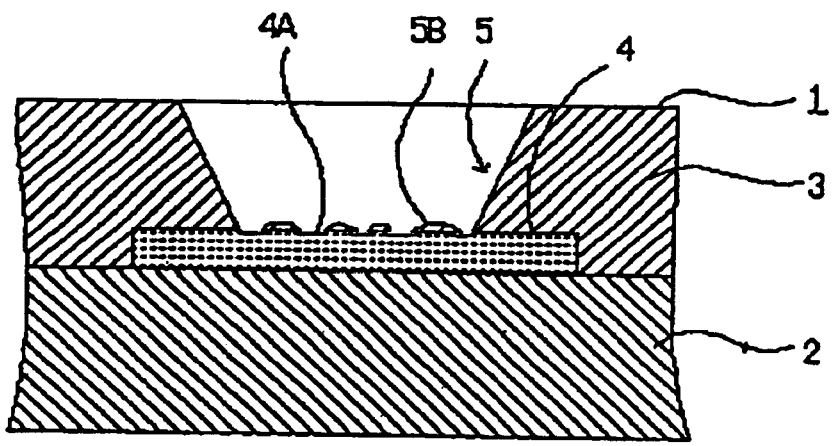
Figure 4:
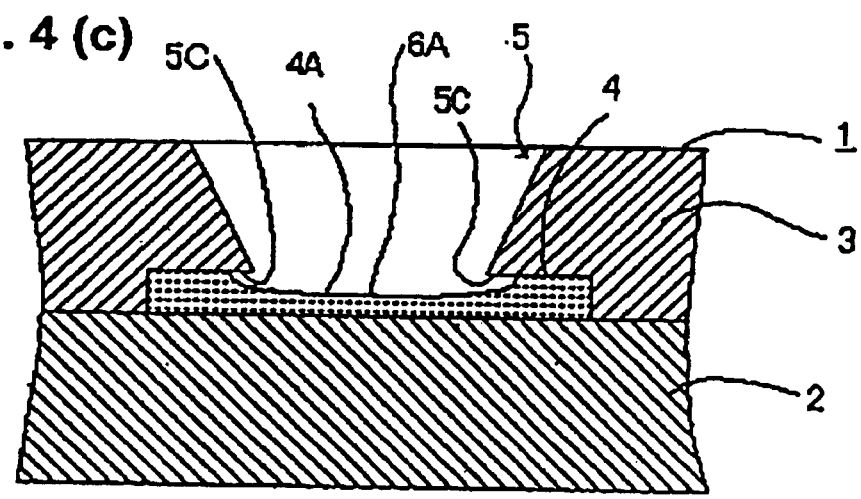
Figure 5:
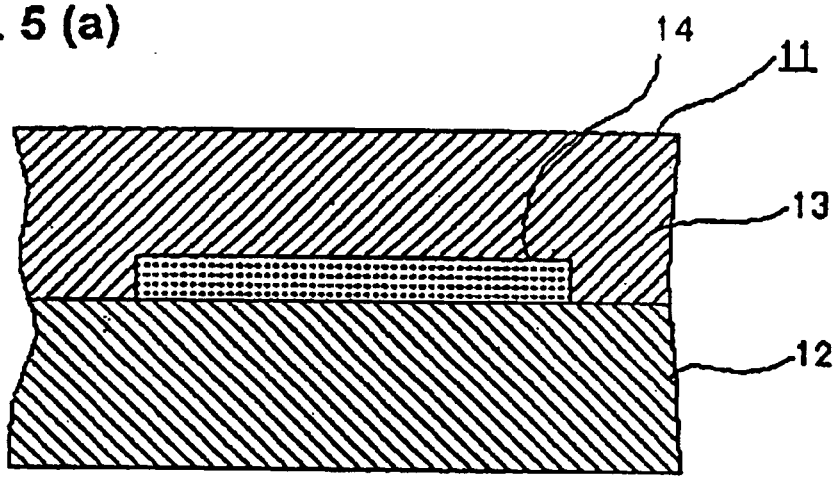
FIGS. 5(a) and 5(b) are explanatory views with schematic cross sections, illustrating conventional idealistic steps for making a via-conductor formed in a via hole connecting lower and upper conductors (14,18) sandwiching an insulating resin layer 13.
FIG. 5(c) is an explanatory view with a schematic cross section, illustrating an electrical connection failure between the upper and lower wiring conductors (14,18) due to a remaining bottom resin 15A in fabricating a multilayer-wiring substrate.
Figure 5:
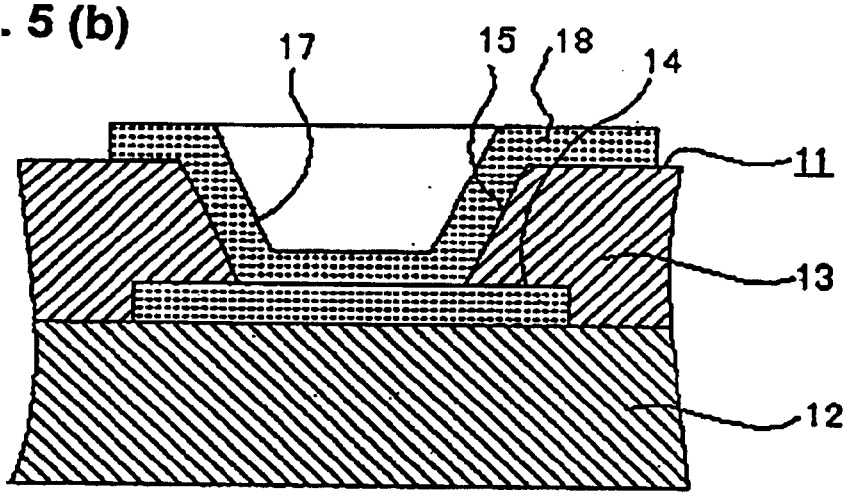
Figure 5:
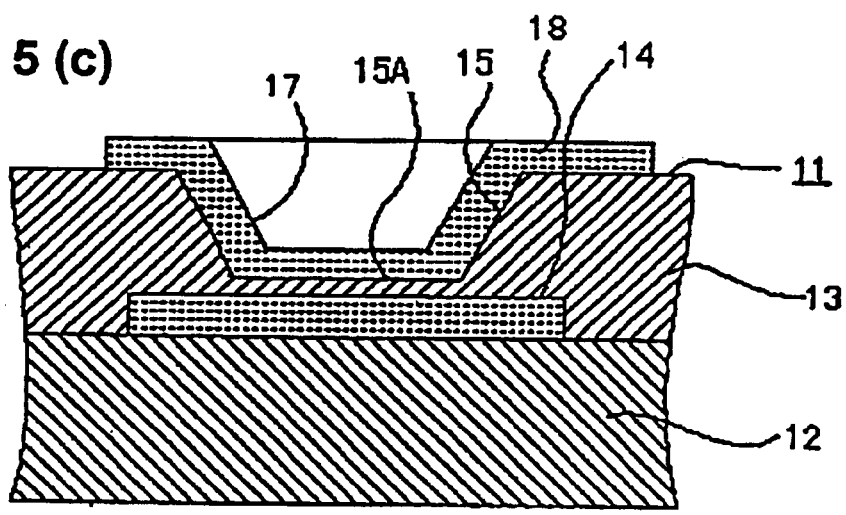

If the conductor is etched in an amount of more than 30% of the thickness thereof, too much resin is removed from the bottom of the via-hole, thereby causing formation of an overhang portion 5C of the insulating (dielectric) layer as seen in FIG. 4(c). This is because the etchant etches not only in a thickness direction but also in a planar direction. Subsequently, when a wall of a via-hole 5 is plated with conductor such as copper in a later step in order to form a via-conductor, a plating solution becomes unlikely to follow the profile of the overhang portion 5C. As a result, a conductor is not formed on the overhang portion 5C, resulting in poor electrical continuity.

Figure 1:
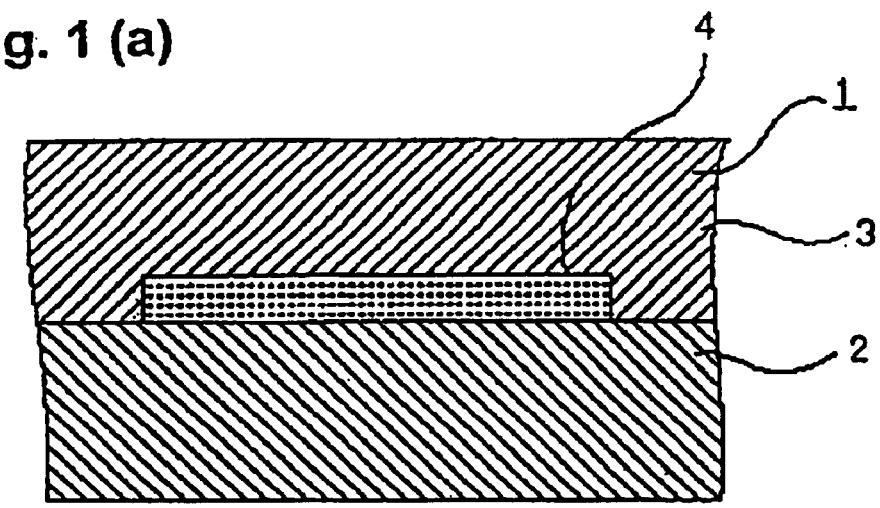
FIG. 1(a) is an explanatory view with a schematic cross section illustrating one of the steps in a method for fabricating a multilayer-wiring substrate (1), according to the invention, wherein is shown a photosensitive resin layer (3) coated on a wiring conductor (4) formed on an insulating layer (2).
FIG. 1(b) is an explanatory view with a schematic cross section illustrating a step of development in lithography performed in the multilayer-wiring substrate of FIG. 1(a), wherein is shown a via-hole 5 formed in the insulating resin layer (3).
FIG. 1(c) is an explanatory view with a schematic cross section, illustrating a residual film 5A remaining as a filmy resin after an eaves (3A) is taken in the step shown in FIG. 1(b).
Figure 1:
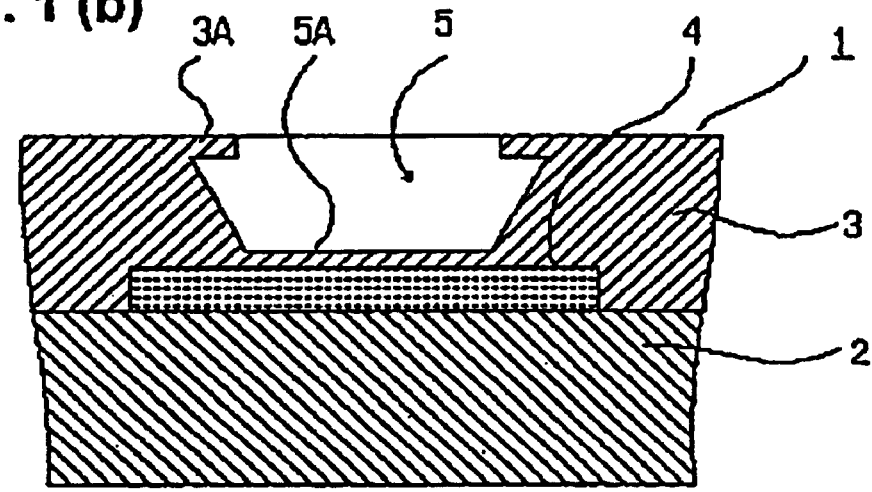
Figure 1:
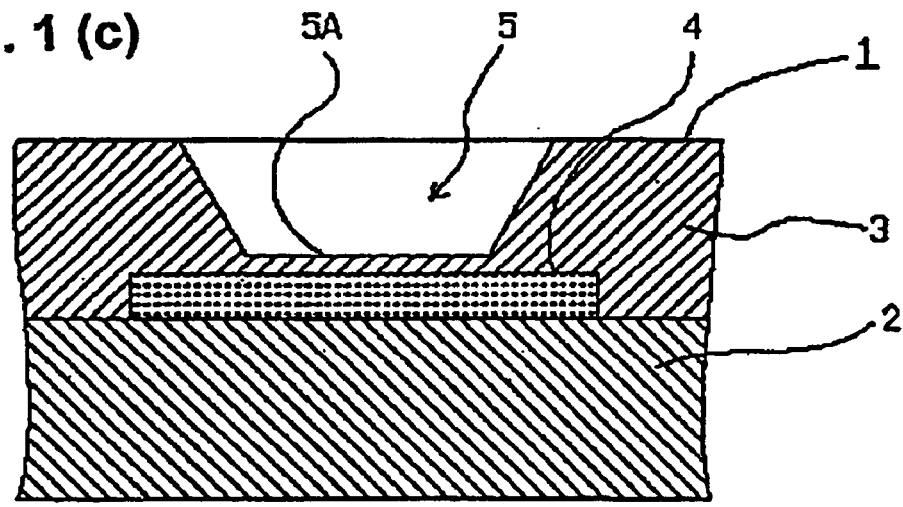
Figure 2:
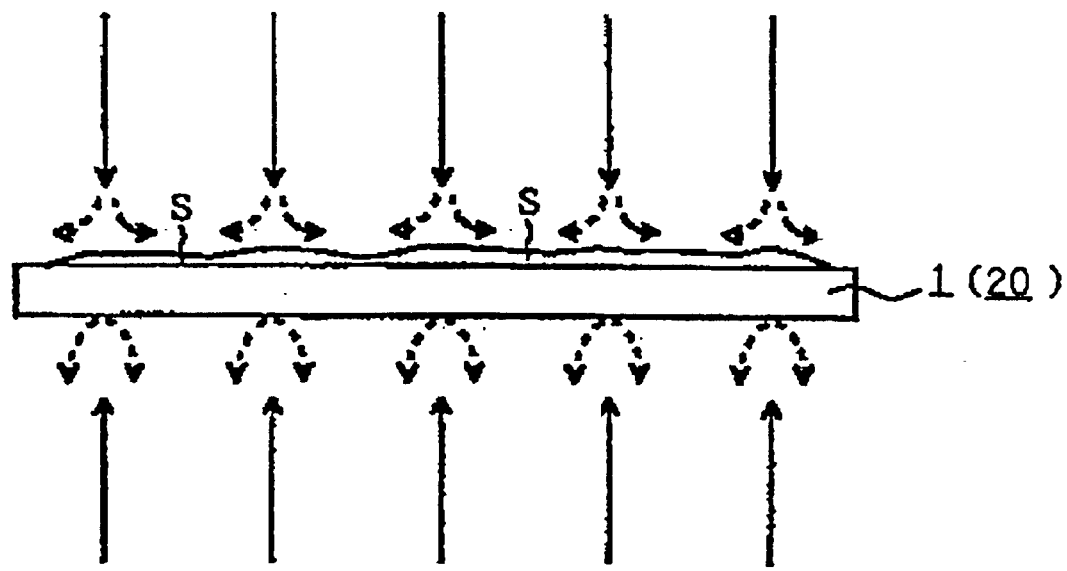
FIG. 2 is an explanatory view with a schematic cross section illustrating a step used in a method for fabricating a multilayer-wiring substrate according to the invention, showing the multilayer-wiring substrate (1) being kept horizontally so that a lithography developer liquid for making a via hole is fed perpendicularly to a plane of the substrate (1).
Figure 3:
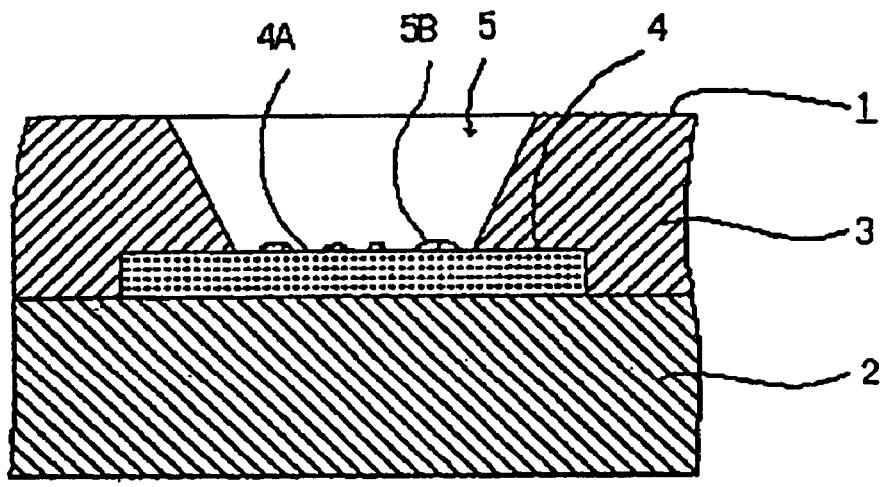
FIG. 3(a) is an explanatory view with a schematic cross section illustrating undesired fragments 5B adhering to the wiring conductor 4A at a bottom of a via-hole after etching the insulator resin layer (5 A) of FIG. 1(c).
FIG. 3(b) is an explanatory view with a schematic cross section illustrating a recessed surface (6A) of the wiring conductor (4) formed by etching the bottom conductor 4A of FIG. 3(a).
FIG. 3(c) is an explanatory view with a schematic cross section illustrating a via-conductor 7 formed on the recessed surface (6A) and on an inner peripheral wall of the via-hole (5) of the FIG. 5(b) and is extended to a wiring conductor layer (8) by plating.
Figure 3:
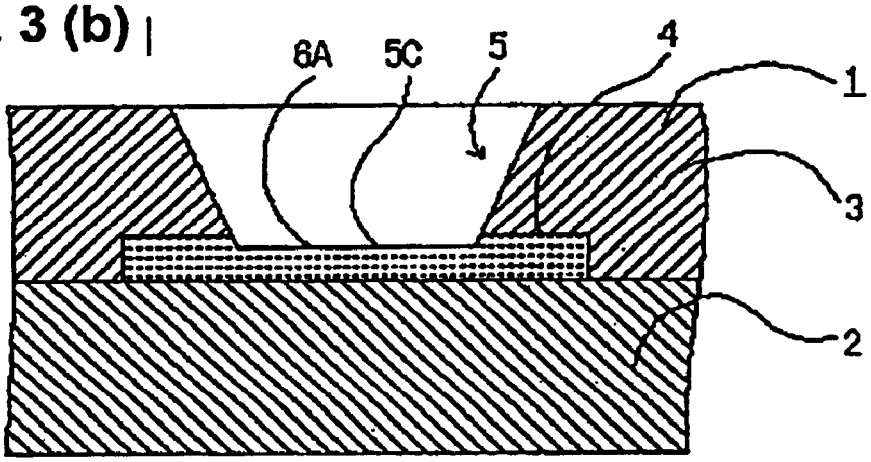
Figure 3:
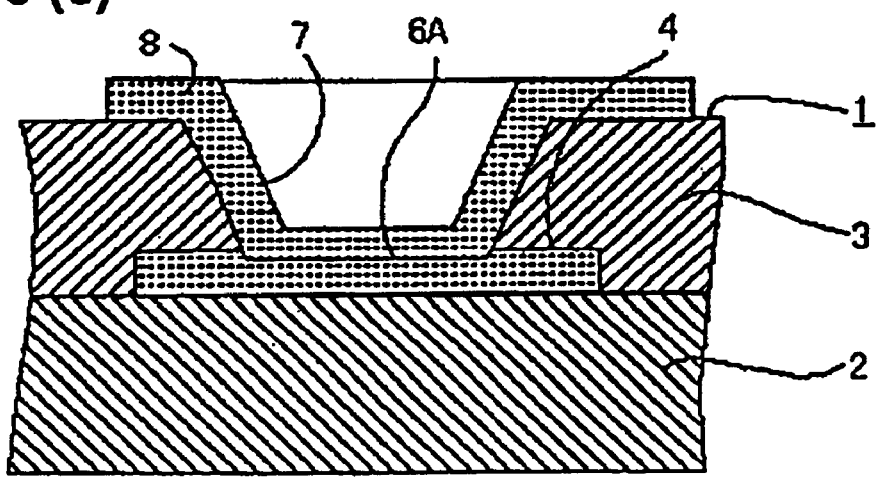

In an aspect of the method of the present invention for fabricating a multilayer-wiring substrate as described above, the multilayer-wiring substrate having the photosensitive resin layer that is subjected to development in photolithography is kept in a substantially horizontal position and the multilayer-wiring substrate is turned upside down during the development as seen in FIG. 2. The reason why the substrate is turned upside down during development in photolithography is due to a different development between the upper and lower sides of the multilayer-wiring substrate (1). Specifically, on the top side of the multilayer-wiring substrate(1), developer S is apt to remain, and eluted resin is apt to accumulate at the bottom of a via-hole in the process of formation. As a result, new developer becomes less likely to be fed to the bottom of the via-hole in the process of formation, resulting in relatively slow development speed in the depth direction of the via-hole.

By contrast, on the other side of the multilayer-wiring substrate, eluted resin and old developer are ejected by new developer. Accordingly, new developer is always fed deeply into the via-hole in the process of formation, resulting in a relatively fast development speed in a depth direction of the via-hole.

By this aspect in the method of the present invention for fabricating a multilayer-wiring substrate that has via holes on both sides thereof, the multilayer-wiring substrate may be turned upside down during development, thereby preventing variation in development speed between the upper and lower sides of the multilayer-wiring substrate. Accordingly, the amount or thickness of resin remaining on a via-hole bottom is substantially identical between the top side and the other side of the multilayer-wiring substrate. In other words, no variation in etching effect may arise between the top and back of the multilayer-wiring substrate.

Methods for depositing a photosensitive resin on a substrate surface include application of the photosensitive resin by screen printing or spin coating, and affixing a photosensitive film formed of the photosensitive resin.

Since the wiring conductor is formed of an electrically conductive metal such as copper, nickel, gold, and silver, an electroless-plating layer or electroplating layer formed of such metal is used for wiring. The wiring conductor may be formed according to a known subtractive process or additive process.

When the electroless plating is performed as pretreatment, a growth nucleus of, e.g., Pd or Au for electroless plating may be affixed to a site where an electroless plating layer is to be formed.

An embodiment of a method of the present invention for fabricating a multilayer-wiring substrate 1 will next be described in detail with reference to FIGS. 1(a) to 3(c).

A photosensitive resin sheet (1) (e.g. PROBICOAT: trade name, product of Nippon Paint Co., Ltd.) is affixed onto a lower conductor (4) having about 0.017 mm which has been formed on the upper surface of an insulating or rather dielectric resin layer (2) by copper plating performed according to a known semi-additive process, thereby forming dielectric resin layer (3) as seen in FIG. 1(a). Next, the dielectric resin layer (3) is semi-cured by applying heat at a temperature of 80° C. for 15 minutes and is then exposed to light using an unillustrated photomask to thereby form a photo-cured layer on the surface of the dielectric resin layer (3).

Subsequently, the dielectric resin layer (3) is further heated at a temperature of 80° C. for 45 minutes so as to be further semi-cured to a hardness capable of enduring in a subsequent development step in lithography through which a via-hole (5) is formed. Notably, a portion of the dielectric resin layer (3) remains at a bottom portion of the via-hole (5) as a residual film (5A), as seen in FIG. 1(c).

The development step is carried out while the multilayer-wiring substrate 1 is held horizontally as shown in FIG. 2. By holding the multilayer-wiring substrate (1) horizontally, the via-hole (5) is formed perpendicularly to a surface of the multilayer-wiring substrate (1) (in the depth direction). However, when the multilayer-wiring substrate (1) is held horizontally, development speed varies between the sides of the multilayer-wiring substrate (1). Therefore, the multilayer-wiring substrate (1) is turned upside down during development, thereby avoiding variation in development speed between upper and lower sides of the multilayer-wiring substrate 1 if the substrate needs to be developed on both sides. Accordingly, the thickness of resin remaining at the bottom portion (5A) of the via-hole (5) becomes substantially identical between the upper and lower sides.

At development, an eaves (3A) is formed at an upper edge of the via-hole 5 as shown in FIG. 1(b). The eaves (3A) may be cut off by means of a waterjet, resulting in a via-hole shape as seen in FIG. 1(c).

Next, the resin film (5A) on the via-conductor (4) and resin at the wall of the via-hole (5) are etched. As a result of this resin-etching step, the resin film (5A) remaining at the bottom portion of the via-hole (5) is etched, thereby exposing a portion of the upper surface (4A) of the lower conductor (4) as seen in FIG. 3(a). However, even after the resin-etching step, the residual resin (5B) still remains fragmentary on an upper surface (4A) of the lower conductor (4), as seen in FIG. 3(a).

Next, the surface of the lower conductor (4) is etched in an amount of about 1.5 μm in thickness using a sodium sulfate solution, thereby removing the residual resin (5B) together with the metal (copper) of the lower conductor (4) (conductor-etching step). Thus, a via bottom 5C wherein the lower conductor (4) is completely exposed for forming a via-conductor is formed at the bottom of the via-hole (5) with a recessed surface (6A). The depth of the depression (6A) is shallow as compared to the thickness of the lower conductor (4) as seen in FIG. 3(b).

Subsequently, an upper conductor (8) is formed on the upper surface of the insulating dielectric resin layer (3) by means of, for example, electroless copper plating or copper electroplating. At the same time, a via-conductor (7) is extendingly formed on the recessed surface (6A) of the lower conductor (4) and on an inner peripheral wall of the via-hole (5) to thereby establish electrical continuity between the upper conductor (8) and the lower conductor (4) as seen in FIG. 3(c).

The above-mentioned conductor-etching step will next be described in more detail with reference to FIGS. 4(a)–4(c). According to the conductor-etching step of the present embodiment, the exposed surface of the lower conductor (4) is etched in an amount of about 1.5 μm in thickness, which is about 9% of a lower conductor thickness of 17 μm. In this case, as shown in FIG. 4(a), the exposed surface (4A) of the lower conductor (4) is etched, and a portion of the surface of the lower conductor (4) underlying the residual fragmental resin (5B) is also etched and undercut. As a result, the residual resin (5B) is removed.

By contrast, when the exposed surface of the lower conductor (4) is etched in an amount of less than 5% of the lower conductor thickness, corresponding to about less than 0.5 μm, a portion of the surface of the lower conductor (4) underlying the residual resin (5B) remains unetched. As a result, the residual resin 5B remains unremoved.

When the exposed surface of the lower conductor (4) is etched in an amount of more than 30% the lower conductor thickness, corresponding to about more than 7 μm, the residual resin 5B can be removed completely. However, etching goes beyond the via-hole (5), namely, i.e., etching reaches a portion of the lower conductor (4) underlying the dielectric resin layer (3), causing formation of an overhang portion (5C) as seen in FIG. 4(c). When the overhang portion 5C becomes excessively large, in a later step of plating the inner wall of the via-hole (5) with the via-hole conductor (7), a plating solution will become unlikely to follow the profile of the overhang portion (5C). This results in poor electrical continuity between the via-hole conductor (7) and the lower conductor (4).

Figure 6:
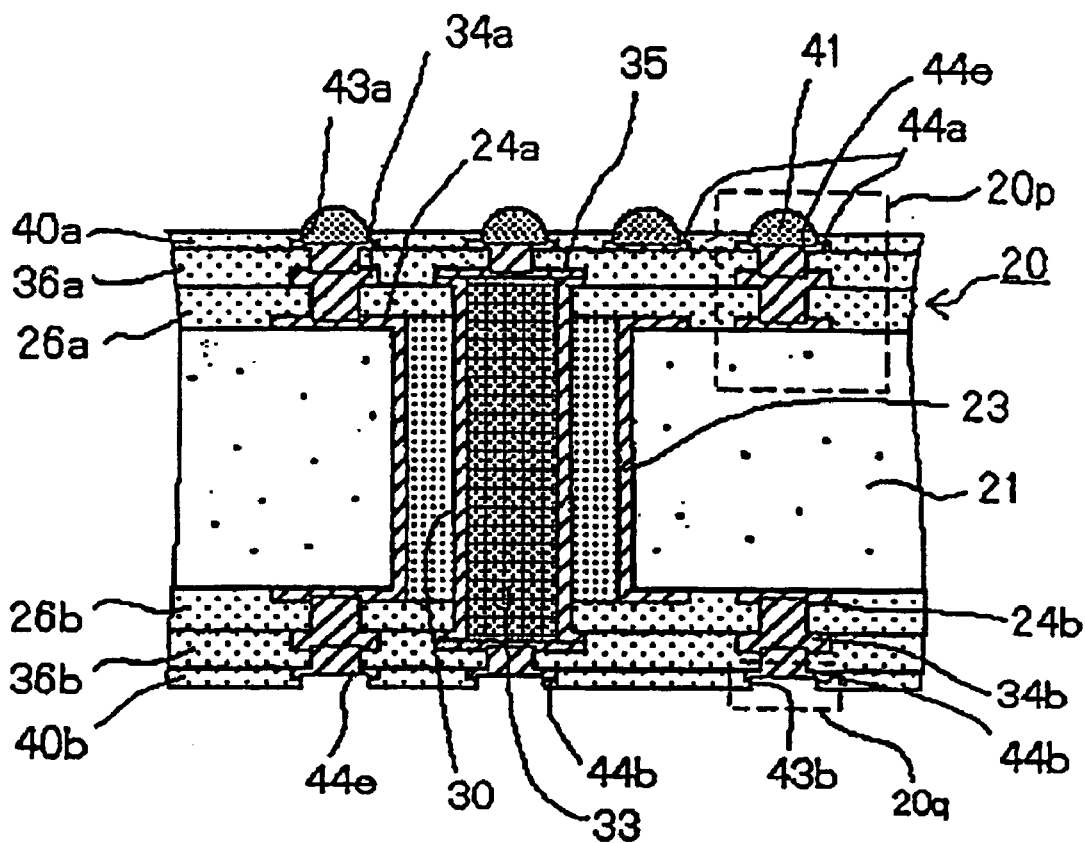
FIG. 6 is a schematic cross sectional view of a multilayer-wiring substrate according to an embodiment of the present invention.

FIG. 6 shows a multilayer-wiring substrate 20 according to an embodiment of the invention, wherein a core insulating substrate 21, a via-conductor 23 plated on a big via-hole wall formed in the core substrate 21, three insulating layers (26a,36a,40a) alternated with three wiring conductors (24a, 34a,44a) formed on a surface of the core substrate 21, another three insulating layers (26b,36b,40b) alternated with another three wiring conductors (24b,34b,44b) formed on the other surface of the core substrate 21, a columnar resin filler 33 penetrating the core substrate 21 and the insulating layers(26a,26b), a conductor layer 35 having a recess plated on an end of the columnar resin filler 33 with the other end connecting to the wiring conductor 44b by a via-conductor, two small via-conductors penetrating the insulating layers (26a,36a), two small via-conductor penetrating the insulating layers (26b,36b), and a solder bump 41 formed on a recessed surface of the wiring conductor 44a and in a via-hole made in the insulating layer 40a are in a self-explanatory interrelating configuration to compose a multilayer-wiring substrate.

Figure 9:
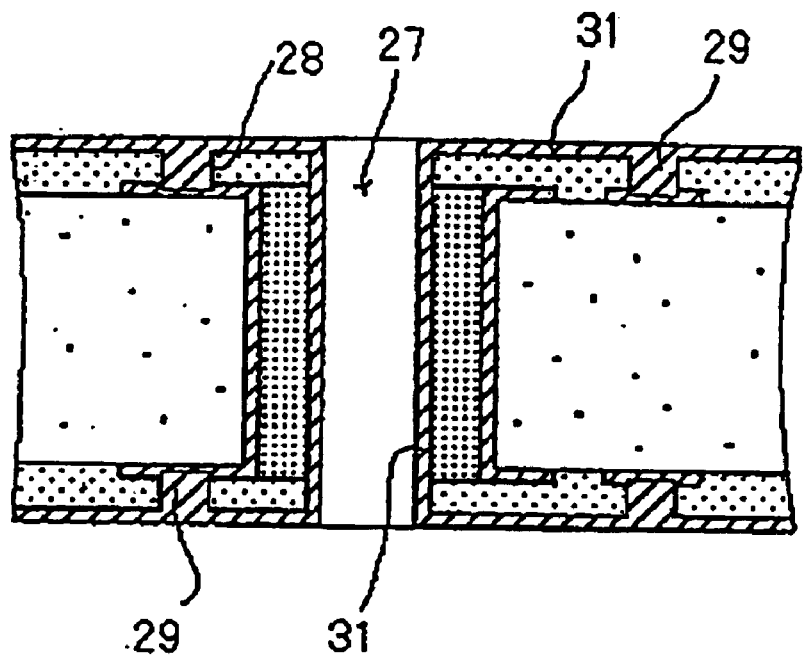
FIGS. 9(a) and 9(b) schematically show steps for making a multilayer-wiring substrate following the steps shown in FIGS. 8(a), 8(b) and 8(c), in a method embodied according to the present invention.
Figure 9:
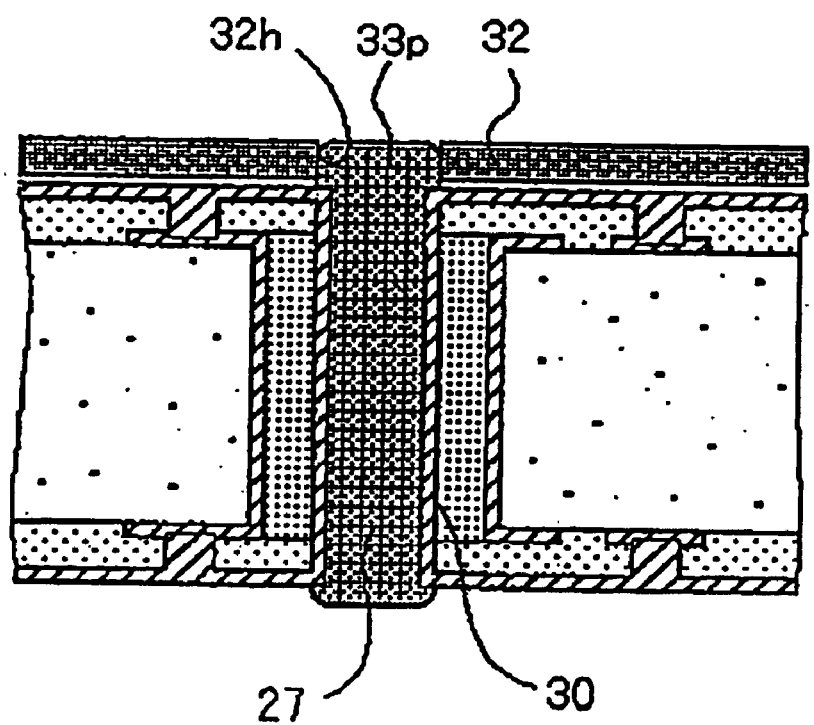
Figure 10:
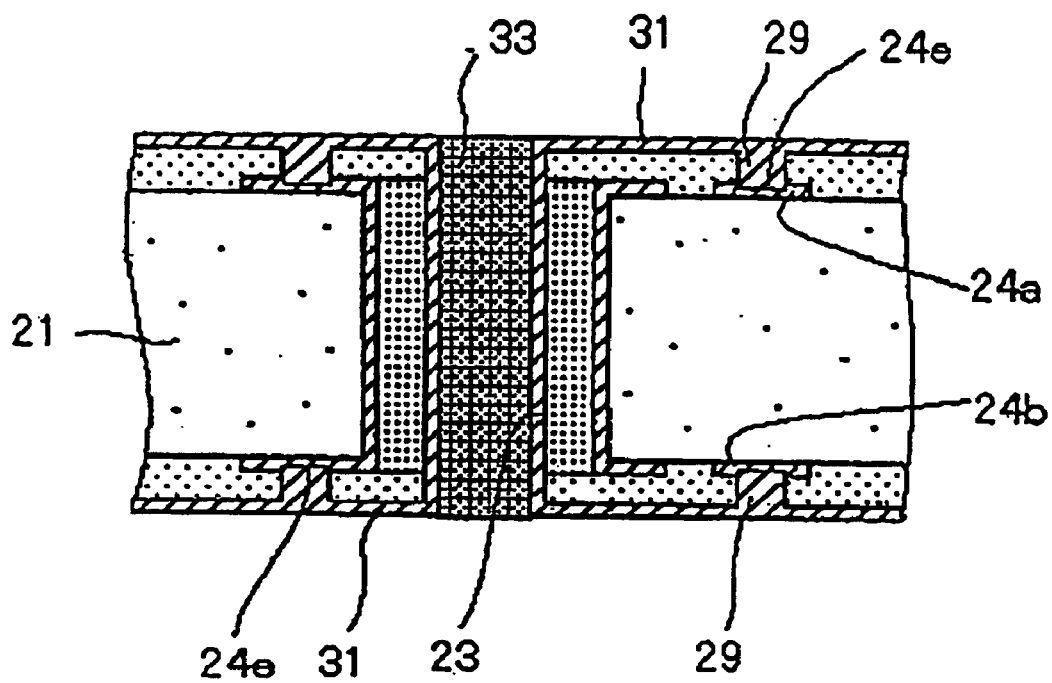
FIGS. 10(a) and 10(b) schematically show further steps for making a multilayer substrates following the steps shown in FIGS. 9(a) and 9(b).
Figure 10:
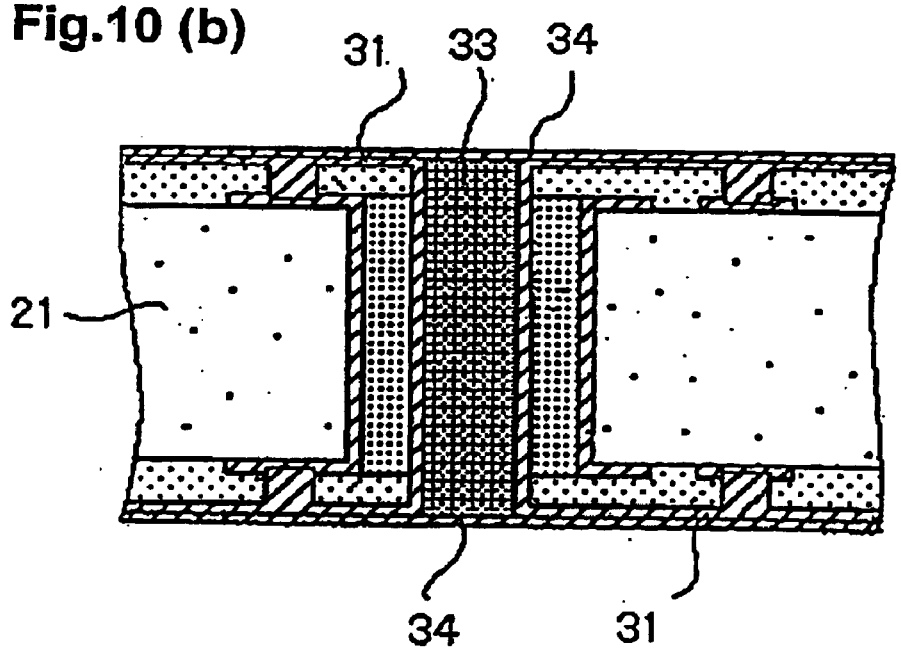
Figure 11:
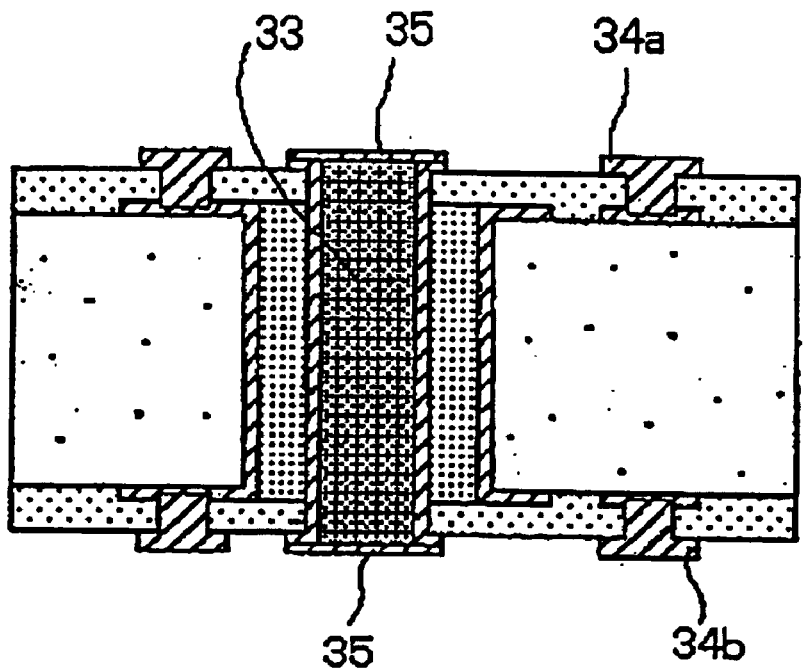
FIGS. 11(a) and 11(b) schematically show further steps for making a multilayer substrates following the steps shown in FIGS. 10(a) and 10(b).
Figure 11:
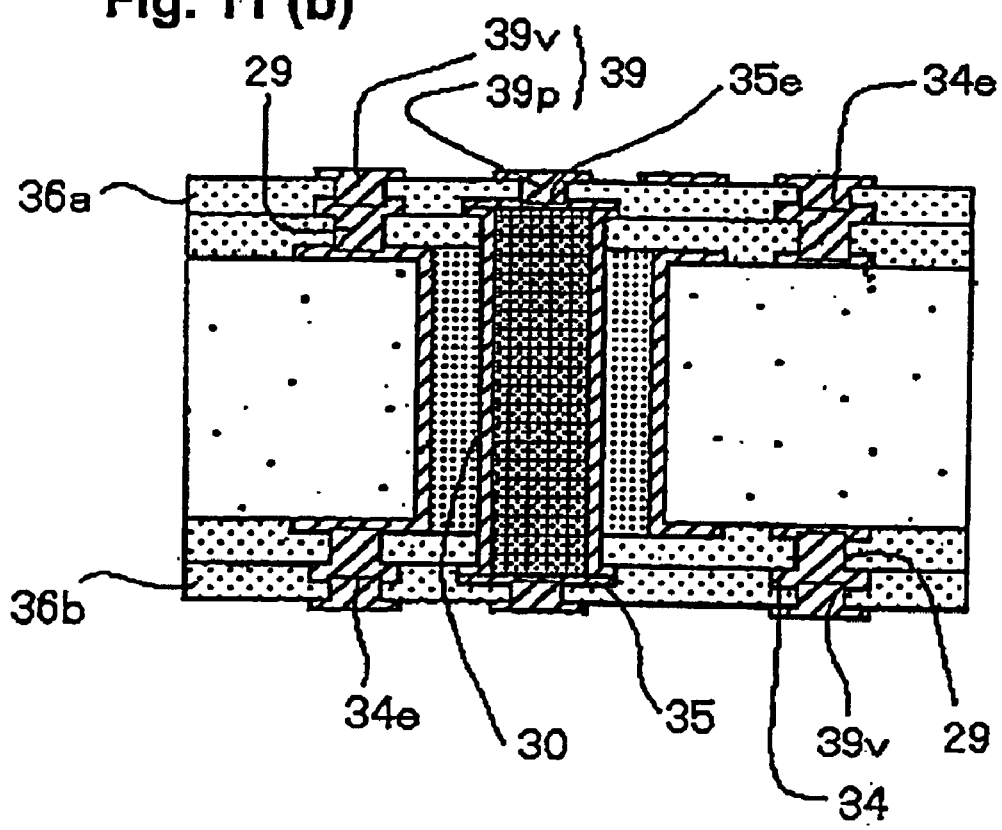

A method for making a multilayer-wiring substrate of FIG. 6 is shown in FIGS. 8(a)–8(c), FIGS. 9(a)–9(b), FIGS. 10(a)–10(b) and FIGS. 11(a)–11(b). Numerical reference numbers not fully explained in FIG. 6 are a via hole 22 and an overall conductor 24 plated on the core surface including on an inner wall 23 in FIG. 8(a), a via-hole resin filler 25 in FIG. 8(b), a large diameter via-hole 27 and small diameter via-holes 28, columnar via-conductors 29 and a plated via conductor 31 formed on an inner wall of the via hole 27 in FIG. 9(a). Another resin filler 33p is pressed in the via hole 27 through a screen hole 32h of a metal screen 32 as shown in FIG. 9(b). After an overall metal-plating of the substrate of FIG. 10 to form a conductor layer 34 as shown in FIG. 10(b), the conductor layer is wired by etching to form wiring conductor (34a,34b) on which another insulating layer 36a is formed as shown in FIG. 11(b). Via-holes are made through the insulating layer 36a and via-conductors (39v, 39p) are formed on the via-conductors 29 by a similar way as previously described.

Figure 7:
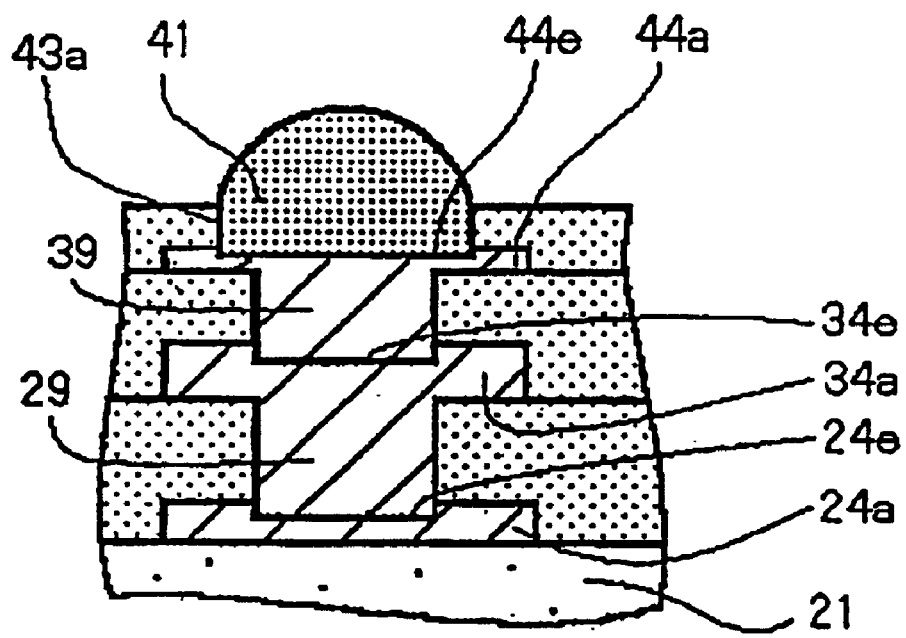
FIG. 7(a) is a schematic cross sectional view of a part of a multilayer-wiring substrate having via-conductors connected each other and aligned in a same axis and penetrating through a plurality of insulating layers, embodied according to the present invention.
FIG. 7(b) is a schematic cross sectional view of a part of an outermost structure of a multilayer-substrate, exposing a recessed surface formed at an end of a via-conductor formed in a via hole penetrating insulating layers, embodied according to the present invention.
Figure 7:
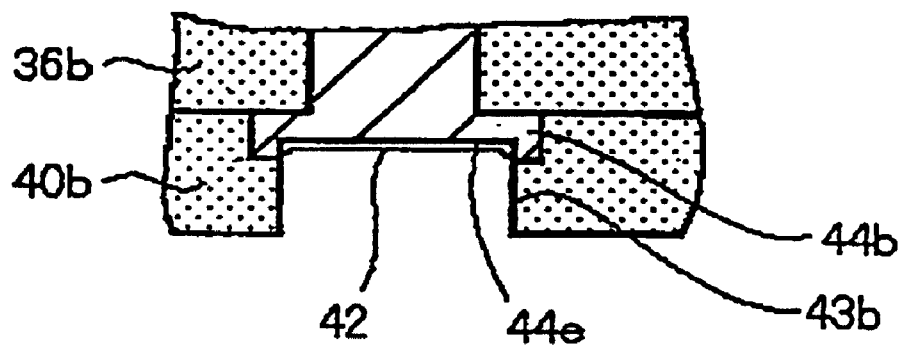
Figure 8:
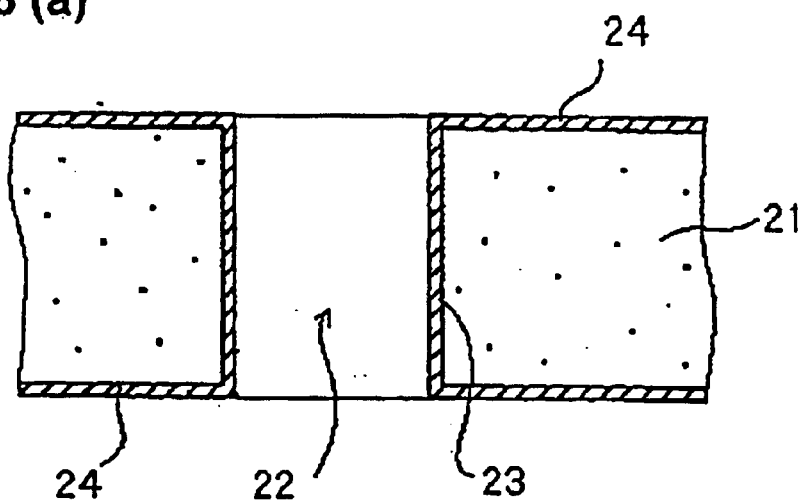
FIGS. 8(a), 8(b) and 8(c) schematically show steps for making a multilayer-wiring substrate, in a method embodied according to the present invention.
Figure 8:
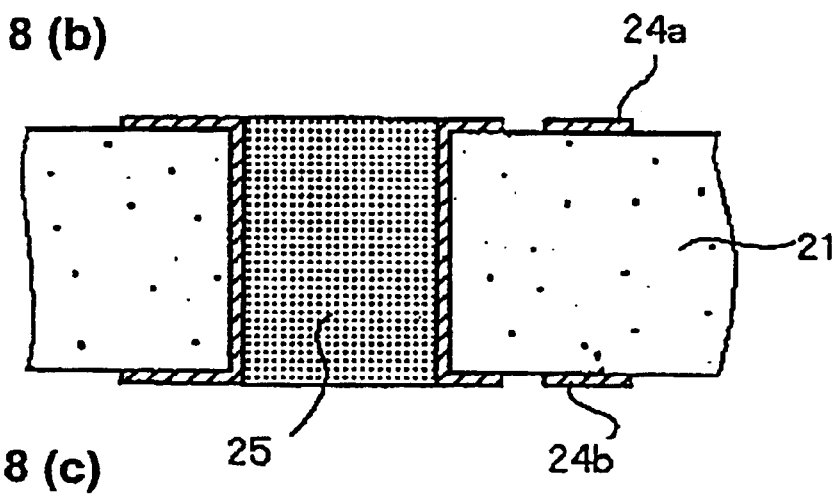
Figure 8:
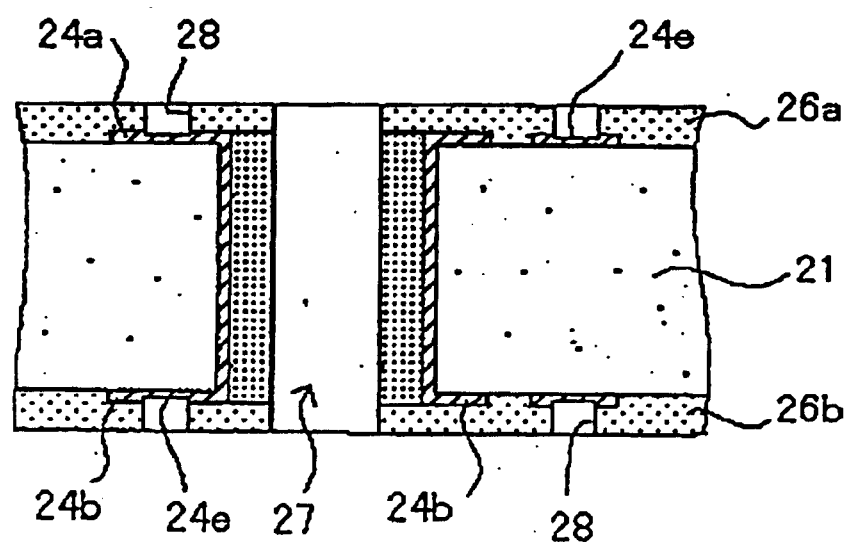

FIG. 7(a) shows an enlarged partial view of FIG. 6, illustrating a configuration of via-conductors aligned in series, wherein an end of a columnar via conductor 29 formed by plating connects the wiring conductor 24a formed on the core substrate 21 and the wiring conductor 34a formed on the insulating layer 26a (of FIG. 6) at a position of the recessed surface 24e formed at the wiring conductor 24a by chemical etching. An end of a second via conductor 39 is connected with the recessed surface 34e formed at the wiring conductor 34a formed on the other surface of the insulating layer 26a. The other end of the via conductor 39 has a recessed surface 44e of the wiring conductor 44a formed on the insulating layer 36a(of FIG. 6), on which recessed surface a solder bump 41 is formed.

FIG. 7(b) shows another enlarged partial view of FIG. 6, wherein a recessed surface 44e of the wiring conductor 44b that extends to a via conductor penetrating the insulating layer 36 is plated with a metal 44 that is exposed in a via-hole made in the insulating layer 40b.

Figure 12:
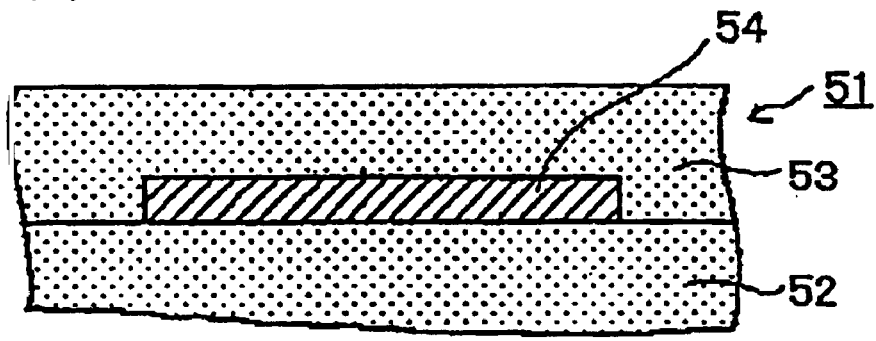
FIGS. 12(a) and 12(b) schematically illustrate a sequence of steps for making a via hole by laser-drilling, showing undesired material splashed in and around the via hole.
FIG. 12(c) schematically shows a resultant via hole after an inner wall of the via hole shown in FIG. 12(b) is etched and the undesired material on the wall is removed but not completely removed from a bottom surface of the wiring conductor, according to a method of the invention.
Figure 12:
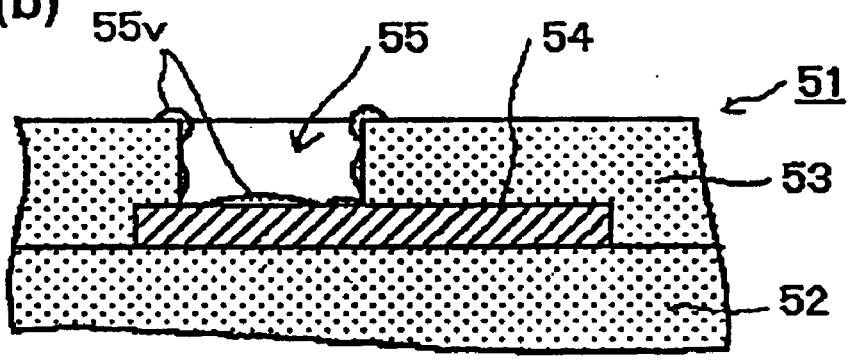
Figure 12:
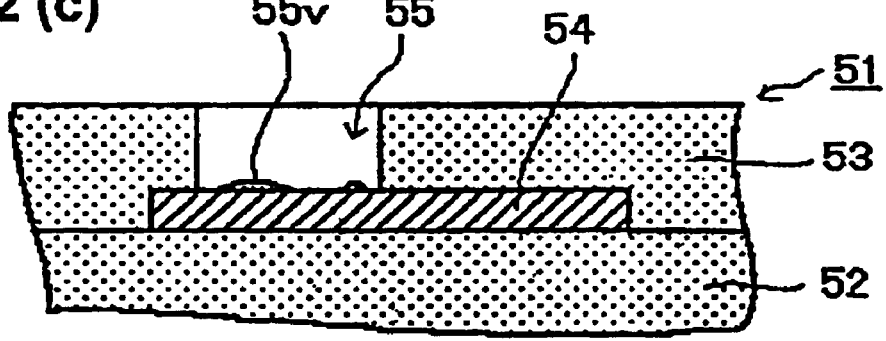

FIGS. 12(a) and 12(b) schematically illustrate a sequence of steps for making a via hole 55 by laser-drilling, showing undesired material 55b splashed in and around the via hole and on the wiring conductor 54.

FIG. 12(c) schematically shows a resultant via hole after an inner wall of the via hole shown in FIG. 12(b) is etched with a resin-etchant. The undesired material 55v on the wall is removed but not completely removed from a bottom surface of the wiring conductor 54, in a step preferably used in the method of the invention.

Figure 13:
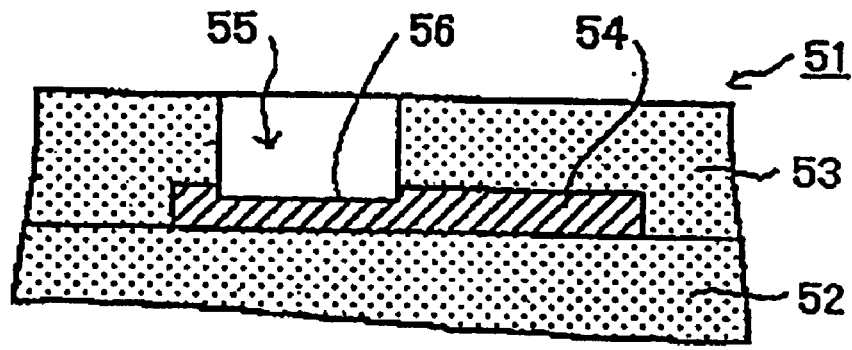
FIGS. 13(a)–13(c) illustratively show a method of connecting wiring conductors separated by an insulating layer in a method of the invention, wherein a connection of the conductors is made at a recessed surface formed in the conductor by etching.
Figure 13:
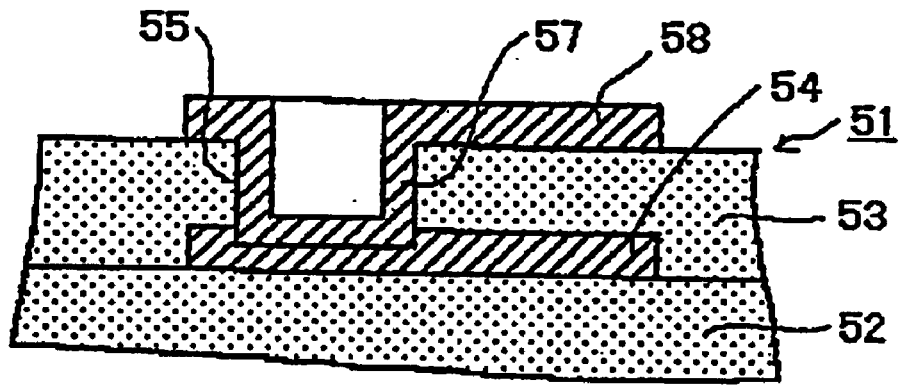
Figure 13:
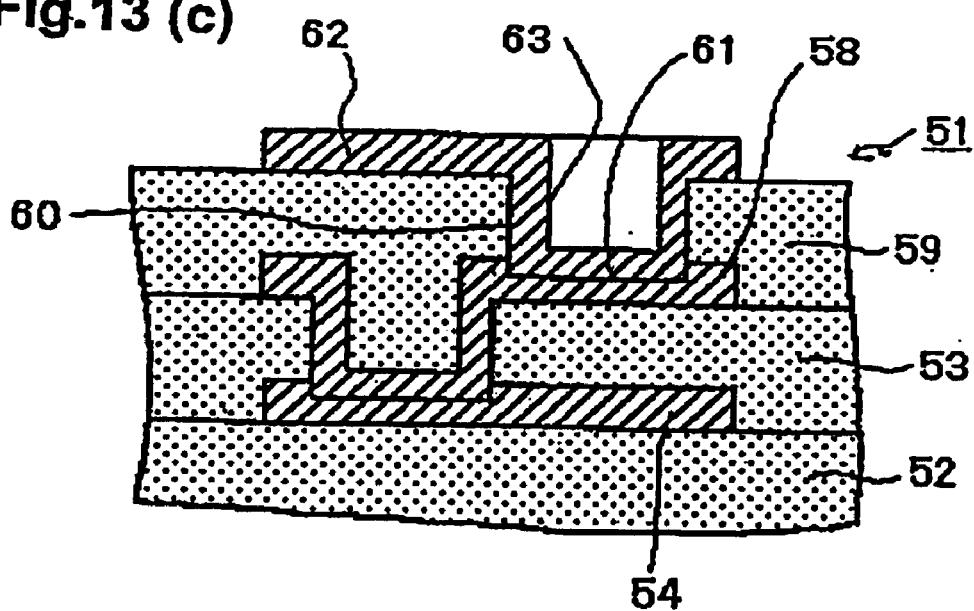

FIGS. 13(a)–13(c) illustratively shows a method of connecting wiring conductors (54,58,62) separated by insulating layers(53,59) according to the invention, wherein a connection of the conductors(58,62) is made by an inner wall via conductor 63 at a recessed surface 61 formed in the conductor 53.

As described above, according to the present invention, after a via-hole is formed by lithographic development or by laser-drilling in the insulating dielectric layer, a resin-etching step and a conductor-etching step are performed. Thus, no resin remains at the bottom of the via-hole, thereby reliably establishing electrical continuity between a lower conductor and a via-hole conductor.

A development step for making via holes in photosensitive layers of the multilayer-wiring substrate is performed by keeping the substrate plane horizontally and by turning the multilayer-wiring substrate upside down, thereby avoiding variation in development performance between the upper and lower sides of the multilayer-wiring substrate. Accordingly, in the later resin-etching and conductor-etching steps, no variation in etching effect arises between the upper and lower sides of the multilayer-wiring substrate, thereby establishing proper electrical continuity between the lower conductor and the via-hole conductor.

Since the via-conductor formed in the via hole is connected with the recess surface of the wiring conductor inside the multilayer-wiring substrate, a firm mechanical and electrical connection is assured between the wiring conductors sandwiching the insulating layers.

While the invention has been described in detail and with reference to specific embodiments thereof, it will be apparent to one skilled in the art that various changes and modifications can be made therein without departing from the spirit and scope thereof.

We claim:

1. A multilayer-wiring substrate comprising:
   a first wiring conductor with a recessed surface formed by etching a surface of the first wiring conductor,
   a first insulating layer formed on a surface of the first wiring conductor except over the recessed surface so that a first via-hole penetrates through the first insulating layer to the recessed surface; and
   a second insulating layer formed on the other surface of the first wiring conductor, wherein a depth of the recessed surface is 5–30% of the thickness of the wiring conductor, and said conductor comprises copper.

2. A multilayer-wiring substrate as claimed in claim 1, further comprising:
   a first via-conductor plated on an inner peripheral wall of the first via-hole and extendingly plated on the recessed surface of the first wiring conductor that forms a bottom of the via-hole; and
   a second wiring conductor formed on the first insulating layer and extendingly connecting with the first via-conductor.

3. A multilayer-wiring substrate as claimed in claim 2, further comprising:
   a third insulating layer formed on the first insulating layer and on the second wiring conductor;
   a second-via hole penetrating through the third insulating layer;
   a second via conductor plated on a inner peripheral wall of the second via-hole;
   and a third wiring conductor formed on the third insulating layer and extendingly connecting to the second via-conductor,
   wherein the second wiring conductor has a recessed surface on which the second via conductor is formed by plating, the recessed surface being formed by etching.

4. A multilayer-wiring substrate as claimed in claim 1, further comprising:
   a solder bump adhering to the recessed surface of the first wiring conductor and formed in the first via-hole.

5. A multilayer-wiring substrate as claimed in claim 1, wherein the insulator comprises a material selected from the group consisting of resin, glass, ceramic and mixtures thereof.

6. A multilayer-wiring substrate as claimed in claim 1, further comprising:
   at least one of gold and nickel plated on the recessed surface of the wiring conductor.

7. A multilayer-wiring substrate as claimed in claim 1, further comprising:
   a columnar via-conductor formed in a via hole that penetrates at least two insulating layers, the via-conductor having a recessed end surface positioned in the via-hole.

8. A multilayer-wiring substrate comprising:
   a first wiring conductor having top and bottom surfaces; a first insulating layer formed on the top surface of the first wiring conductor; a first via-hole penetrating through the first insulating layer; and a first columnar via-conductor formed in the via-hole,
   wherein the first wiring conductor has a first recessed surface formed at the top surface of the first wiring conductor so that a bottom end of the first columnar via-conductor contacts the first recessed surface of the first wiring conductor, a depth of the recessed surface is 5–30% of the thickness of the wiring conductor, and said conductor comprises copper.

9. A multilayer-wiring substrate as claimed in claim 8, further comprising:
   a second wiring conductor formed on top of the first insulating layer and extendingly forming a top end of the first columnar via-conductor; a second insulating layer formed on the top surface of the second wiring conductor; a second via-hole penetrating through the second insulating layer to the second wiring conductor; and a second columnar via-conductor formed in the via-hole,
   wherein the second wiring conductor has a second recessed surface in alignment with the end surface of the first columnar via-conductor so that an end of the second columnar via-conductor contacts the second recessed surface of the second wiring conductor.

10. A multilayer-wiring substrate as claimed in claim 9, further comprising:
    a third wiring conductor formed on top of the second insulating layer and extendingly forming an end of the second columnar via-conductor formed in the second via-hole; a third insulating layer covering the third wiring conductor; and a third via-hole penetrating through the third insulating layer,
    wherein the third wiring conductor extendingly forming the end of the second columnar via conductor has a third recessed surface for soldering a solder bump to be formed in the third via-hole.

11. A method for fabricating a multilayer-wiring substrate having a via-conductor in a via-hole, said multilayer-wiring substrate comprising:

a wiring conductor with a recessed surface formed by etching a surface of the wiring conductor, a first insulating layer formed on a surface of the wiring conductor except over the recessed surface so that a via-hole penetrates through the insulating layer to the recessed surface;

a via-conductor plated on an inner peripheral wall of the via-hole and extendingly plated on the recessed surface of the wiring conductor that forms a bottom of the via-hole; and a second insulating layer formed on the other surface of the wiring conductor, wherein a depth of the recessed surface is 5–30% of the thickness of the wiring conductor, and said conductor comprises copper, said method comprising:

forming an insulating layer on a wiring conductor comprising copper;

forming a via-hole in the insulating layer by removing the insulating layer to an extent that the insulating layer in the via-hole becomes fragmented and adheres to the wiring-conductor located at the bottom of the via-hole;

then etching the wiring conductor located at the bottom of the via-hole so that the fragments are removed and a recessed surface is formed in an amount of 5–30% of the thickness of the wiring conductor;

then forming a via-conductor in the via-hole by plating a metal on an inner peripheral wall of the via-hole and extendingly plating the metal on the recessed surface of the wiring conductor; and forming a second insulating layer on the other surface of the wiring conductor.

12. A method for fabricating a multilayer-wiring substrate having a via-conductor in a via-hole as claimed in claim 11, further comprising:

etching an inner peripheral wall of the via-hole that penetrates the insulating layer before etching the wiring conductor located at the bottom of the via-hole.

13. A method for fabricating a multilayer-wiring substrate, said multilayer-wiring substrate comprising:

a wiring conductor having top and bottom surfaces;

an insulating layer formed on the top surface of the wiring conductor;

a via-hole penetrating through the insulating layer; and a columnar via-conductor formed in the via-hole, wherein the wiring conductor has a recessed surface formed at the top surface of the wiring conductor so that a bottom end of the first columnar via-conductor contacts the recessed surface of the wiring conductor, a depth of the recessed surface is 5–30% of the thickness of the wiring conductor, and said conductor comprises copper, said method comprising the steps of:

forming a photosensitive resin layer on a wiring conductor comprising copper;

exposing the photosensitive resin layer and then developing to form a via-hole therein;

chemically etching resin at a surface of the photosensitive resin layer and resin at an inner wall of the via-hole;

chemically etching a surface of the wiring conductor exposed at a bottom of the via-hole so as to form a recessed surface in an amount of 5–30% of the thickness of the wiring conductor; and forming a via-conductor in the via-hole by plating a metal on an inner peripheral wall of the via-hole and extendingly plating the metal on the recessed surface of the wiring conductor.

14. A method for fabricating a multilayer-wiring substrate as claimed in claim 13, wherein said developing comprises holding the multilayer-wiring substrate substantially horizontally and turning the substrate upside down during the development so that a via-hole axis is formed perpendicular to the recessed surface of the wiring conductor.

* * * * *